United States Patent
Sander et al.

(10) Patent No.: US 7,515,885 B2
(45) Date of Patent: Apr. 7, 2009

(54) COMMUNICATIONS SIGNAL AMPLIFIERS HAVING INDEPENDENT POWER CONTROL AND AMPLITUDE MODULATION

(75) Inventors: Wendell B. Sander, Los Gatos, CA (US); Ronald A. Meck, Soquel, CA (US); Earl W. McCune, Jr., Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 603 days.

(21) Appl. No.: 11/208,327

(22) Filed: Aug. 19, 2005

(65) Prior Publication Data

US 2006/0052068 A1   Mar. 9, 2006

Related U.S. Application Data

(63) Continuation of application No. 09/834,024, filed on Apr. 11, 2001, now Pat. No. 7,010,276.

(51) Int. Cl.
*H01Q 11/12* (2006.01)
*H04B 1/00* (2006.01)

(52) U.S. Cl. ............... 455/127.3; 455/108; 330/10; 330/136

(58) Field of Classification Search ........... 455/108, 455/115.1, 116, 127.1–127.3; 330/10, 133–136, 330/296–297; 375/300, 302
See application file for complete search history.

(56) References Cited

U.S. PATENT DOCUMENTS

| | | |
|---|---|---|
| 5,251,331 A | 10/1993 | Schwent et al. |
| 5,504,465 A | 4/1996 | Yung et al. |
| 5,872,491 A | 2/1999 | Kim et al. |
| 6,043,707 A | 3/2000 | Budnik |

(Continued)

FOREIGN PATENT DOCUMENTS

WO    WO 00/48307    8/2000

(Continued)

OTHER PUBLICATIONS

European Office Action dated Jul. 4, 2006.

*Primary Examiner*—Lee Nguyen
(74) *Attorney, Agent, or Firm*—McDermott Will & Emery LLP

(57) ABSTRACT

The present invention, generally speaking, provides methods and apparatus for producing an amplitude modulated communications signal, in which a constant-envelope carrier signal is modified in response to a power control signal to produce a modified constant-envelope carrier signal. The modified constant-envelope carrier signal is amplified in response to an amplitude modulation signal to produce a communications signal having amplitude modulation and having an average output power proportional to a signal level of the modified constant-envelope carrier signal. This manner of operation allows wide dynamic range of average output power to be achieved. Because amplitude modulation is applied after amplitude varying circuitry used to produce the modified constant-envelope carrier signal, the amplitude modulation is unaffected by possible non-linearities of such circuitry. In accordance with another aspect of the invention, operation in the foregoing manner at comparatively low average output power levels is combined with switch mode operation at comparatively high average output power levels, enabling high overall efficiency to be achieved. Hence, the disclosed modulator and amplifier combination, in addition to supporting very low power signals, also supports high power signals.

7 Claims, 9 Drawing Sheets

U.S. PATENT DOCUMENTS

| | | | |
|---|---|---|---|
| 6,069,525 | A | 5/2000 | Sevic et al. |
| 6,256,482 | B1 | 7/2001 | Raab |
| 6,381,333 | B1 * | 4/2002 | Suzuki .................. 381/18 |
| 6,529,716 | B1 | 3/2003 | Eidson et al. |

FOREIGN PATENT DOCUMENTS

| | | |
|---|---|---|
| WO | WO 02/084864 A2 | 10/2002 |
| WO | WO 02/084864 A3 | 2/2004 |

* cited by examiner

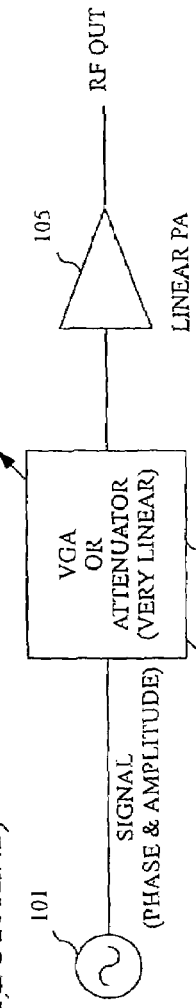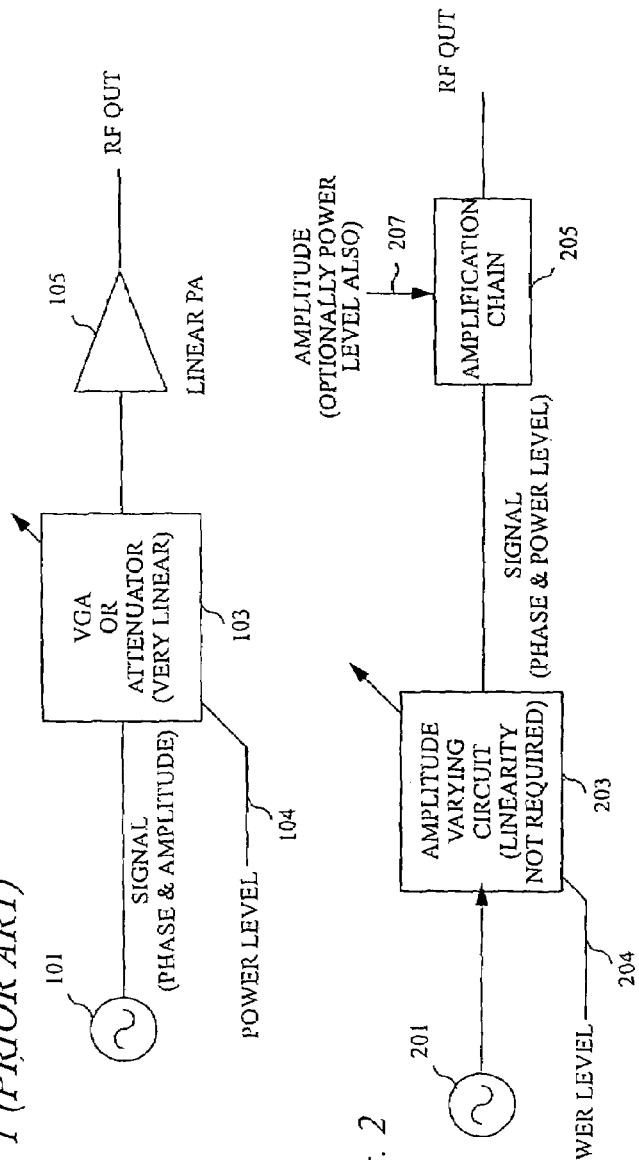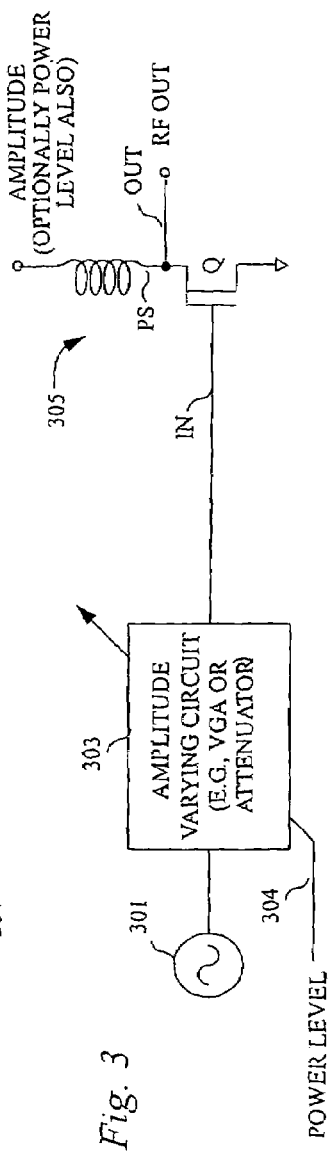

30 dBm rms

EVM = 1.8%

-50 dBm rms

EVM = 2.3%

COMMUNICATIONS SIGNAL AMPLIFIERS HAVING INDEPENDENT POWER CONTROL AND AMPLITUDE MODULATION

CROSS-REFERENCE TO RELATED APPLICATIONS

This is a continuation application of application Ser. No. 09/834,024, filed on Apr. 11, 2001 and issued as U.S. Pat. No. 7,010,276. This application is related to application Ser. No. 11/208,327, filed on the same day as this application and also a continuation of application Ser. No. 09/834,024, filed on Apr. 11, 2001 and issued as U.S. Pat. No. 7,010,276.

BACKGROUND OF THE INVENTION

1. Field of the Invention

The present invention relates to communications signal amplifiers and to power control and amplitude modulation control.

2. State of the Art

High linearity and high energy efficiency are two principal (and usually competing) objectives of conventional communications signal amplifier design. High linearity is required to produce "clean" communications signals that produce a minimum of interference and provide high quality of service. High energy efficiency is desirable particularly for portable, battery-powered devices, as well as for purposes of reducing infrastructure costs.

In a cellular telecommunications system, handsets and other devices communicating with the radio base station are required to transmit at one of many possible power levels depending on the proximity of a particular device to the base station. This average output power control function may for some standards entail a dynamic range of 80 dB. Achieving linearity over this wide dynamic range has proved problematic.

Referring to FIG. 1, a simplified diagram of a conventional communications signal transmitter is shown. A signal generator 101 generates a signal having both amplitude and phase modulation. This signal is applied to an amplitude varying circuit 103 such as a variable gain amplifier (VGA) or variable attenuator controlled in accordance with a power level signal 104. A resulting scaled signal is then applied to a linear amplifier 105 to achieve final amplification. In this arrangement, because the amplitude-modulated signal passes through the amplitude varying circuit 103, the amplitude varying circuit must have very linear performance.

An alternate approach involves polar modulation, in which separate amplitude and phase paths are provided. Polar modulation architectures (and similar architectures in which separate amplitude and phase paths are provided) are described, for example, in U.S. Pat. Nos. 6,191,653, 6,194,963, 6,078,628, 5,705,959, 6,101,224, 5,847,602, 6,043,707, and 3,900,823, as well as French patent publication FR 2768574, all of which are incorporated herein by reference.

Referring in particular to U.S. Pat. No. 6,191,653, a RF power amplifier architecture is described in which separate phase and amplitude paths are provided. The amplifier has multiple stages. For signals having a comparatively high average power level, amplitude modulation is achieved in a final amplifier stage operating in a non-linear mode. In the case of a FET (field effect transistor) active device, for example, drain modulation is applied to the FET in order to impress the desired amplitude modulation upon the output signal. For signals having a low average power level, amplitude modulation is achieved in a preceding amplifier stage (again using drain modulation), the final amplifier stage being operated in linear mode (see column 6). In this manner, a range of amplitude modulation is provided that is larger than can be supported by just drain modulation of the final stage. Achieving an 80 dB dynamic range of average output power using this arrangement, however, remains problematic. Furthermore, any non-linearities in amplitude modulation performed in the driver stage are magnified in the final stage.

The present invention addresses the need for wide dynamic range of average output power without requiring high linearity. When applied in conjunction with switch mode amplification techniques, overall high efficiency may be achieved.

SUMMARY OF THE INVENTION

The present invention, generally speaking, provides methods and apparatus for producing an amplitude modulated communications signal, in which a constant-envelope carrier signal is modified in response to a power control signal to produce a modified constant-envelope carrier signal. The modified constant-envelope carrier signal is amplified in response to an amplitude modulation signal to produce a communications signal having amplitude modulation and having an average output power proportional to a signal level of the modified constant-envelope carrier signal. This manner of operation allows wide dynamic range of average output power to be achieved. Because amplitude modulation is applied after amplitude varying circuitry used to produce the modified constant-envelope carrier signal, the amplitude modulation is unaffected by possible non-linearities of such circuitry. In accordance with another aspect of the invention, operation in the foregoing manner at comparatively low average output power levels is combined with switch mode operation at comparatively high average output power levels, enabling high overall efficiency to be achieved. Hence, the disclosed modulator and amplifier combination, in addition to supporting very low power signals, also supports high power signals.

BRIEF DESCRIPTION OF THE DRAWING

The present invention may be further understood from the following description in conjunction with the appended drawing. In the drawing:

FIG. 1 is a simplified diagram of a conventional communications signal amplifier;

FIG. 2 is a simplified diagram of a communications signal amplifier in accordance with the principles of the present invention;

FIG. 3 is a diagram of a communications signal amplifier like that of FIG. 2 showing one particular amplification chain;

DETAILED DESCRIPTION OF THE PREFERRED EMBODIMENTS

Figure 4:
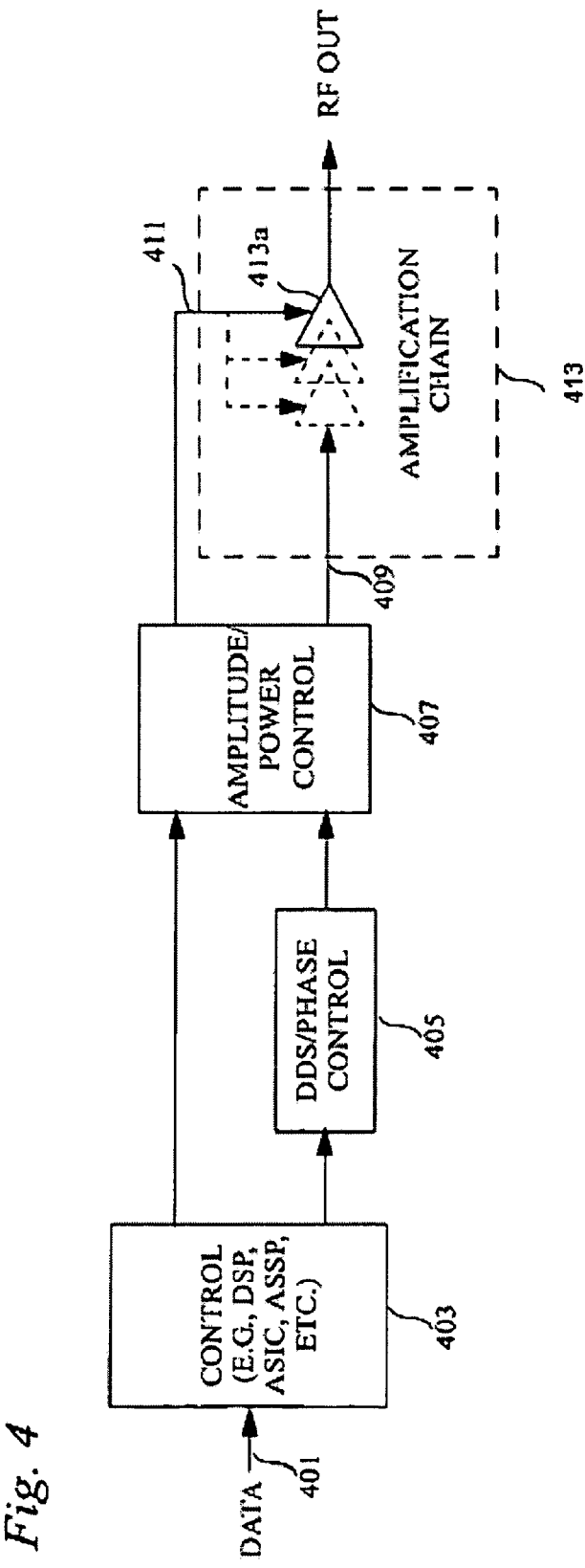
FIG. 4 is a block diagram of a communications transmitter in which the present invention may be used.

Referring now to FIG. 2, there is shown a simplified diagram of a communications signal amplifier in accordance with the principles of the present invention. A signal generator 201 generates a signal typically (though not necessarily) having phase information. This signal is applied to an amplitude varying circuit 203 such as a variable gain amplifier (VGA) or an attenuator, controlled in accordance with a power level signal 204. A resulting scaled signal is then applied to an amplification chain 205. The amplification chain is responsive to a control signal 207 bearing amplitude modulation information (and possibly power level information in addition to that of the power level signal 204) to produce an amplified communications signal (e.g., RF output signal) having the desired amplitude modulation and desired power level.

FIG. 3 shows further details of the communications signal amplifier of FIG. 2, particularly of the amplification chain. In the illustrated embodiment, the amplification chain is shown as having a single final amplifier stage operating in multiplicative mode to achieve both amplitude modulation and final amplification or, at low power levels, attenuation, as the case may be. The final amplifier stage includes a three-terminal active device Q (such as an FET) having a signal input terminal IN, an output terminal OUT and a power supply input terminal PS. An amplitude modulation signal is applied to the power supply input terminal. In this arrangement, because the amplitude-modulated signal does not pass through the amplitude varying circuit 303, the amplitude varying circuit may have non-linear performance. To the extent the non-linear characteristics of the amplitude varying circuit 303 may be ascertained, they may be taken compensated for in setting the power level signal 304 applied to the amplitude varying circuit.

Optionally, power level control, instead of being applied to the final amplifier stage solely through the signal input path IN, may be applied in combination through both the signal input path and the power supply path PS.

The amplitude varying circuit 303 may be a variable gain amplifier (VGA) or a variable attenuator, controlled in accordance with a power level signal. The VGA or variable attenuator may be realized in one stage or several stages, using passive devices, active devices, or some combination of the same, where the active devices (if any) are operated in either "triode mode" or switch mode.

Referring to FIG. 4, a block diagram is shown of a communications transmitter in which the present invention may be used. A data signal 401 is applied to a control block 403, such as a DSP, ASIC, ASSP, etc. In the general case, the control block produces a number of control signals, one or more of which are applied to each of a DDS/phase control block 405 (where DDS stands for direct digital synthesis) and an amplitude/power control block 407. In a specific embodiment, as described below, the control block 403 produces a single phase control signal and multiple amplitude control signals.

An output signal of the DDS/phase control block 405 is applied to the amplitude/power control block 407. Responsive to the output signal of the DDS/phase control block 405 and to control signal(s) from the control block 403, the amplitude/power control block 407 produces a signal output and a power supply output that are applied to a signal input 409 and a power supply input 411, respectively, of an amplification chain 413 (shown in simplified form). The amplification chain 413 has at least one amplification stage 413a and typically two or more amplification stages, as indicated in dashed lines, and amplifies the signal input 409 to produce an amplified communications signals such as an RF output signal, RF OUT.

The amplification chain of FIG. 4 may, in some embodiments, be operated exclusively in "triode mode" or "multiplicative mode" (described more fully below), as opposed to switch mode, across the entire output signal dynamic range. In triode mode, with the active device operating in the triode region, average output power increases with increase of the signal input level and with increase of the power supply input level. Hence, for maximum average output power, levels of the signal input level and the power supply input would be set to maximum levels subject to the requirement of operating the amplifier in multiplicative mode. Similarly, for minimum average output power, levels of the signal input level and the power supply input would be set to minimum levels subject to the requirement of operating the amplifier in multiplicative mode.

When operated in this manner, power efficiency, while not especially high, is improved as compared to more conventional amplifiers in which the power supply input to the amplifier is held fixed. However, amplifier performance is somewhat sensitive to manufacturing and environmental influences. Increased power efficiency and dramatically decreased sensitivity to manufacturing and environmental influences may be achieved by operating the amplification chain, during at least part of the time, in switch mode.

Figure 5:
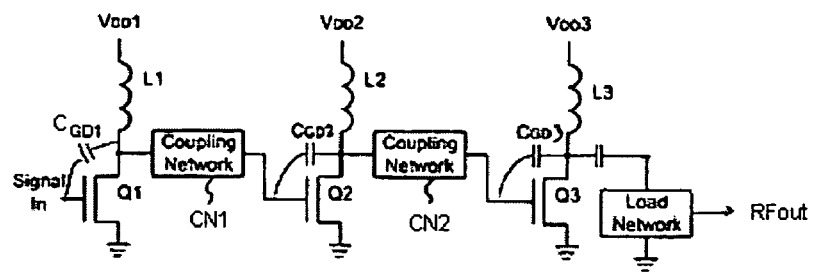
FIG. 5 is a more detailed diagram of the amplification chain of the power amplifier of FIG. 4, in accordance with an exemplary embodiment.

Referring to FIG. 5, a more detailed diagram of the amplification chain of the power amplifier of FIG. 4 is shown, in accordance with an exemplary embodiment. The amplification chain is shown as having three stages, each stage including an active power device. The active devices are illustrated here as FETs (Field Effect Transistors) Q1, Q2 and Q3, but can be any three-terminal gain device. In the illustrated embodiment, the drain terminals of the FETs are each connected through a respective inductive choke, L1, L2 and L3, to a respective power supply input, $V_{DD1}$, $V_{DD2}$, $V_{DD3}$. Hence, the power supply inputs of the three devices may be controlled independently. The source terminals of the active device are coupled to a reference potential, e.g., ground.

A signal input is applied to a gate terminal of the first active device Q1, which produces an output signal at the drain terminal thereof. This output signal is applied to a coupling network CN1 that produces a signal input for the second active device, Q2, which is applied to the gate terminal thereof. Similarly, the output signal produced at the drain of the second active device Q2 is applied to a coupling network CN2 that produces a signal input for the third active device Q3. Note that a parasitic capacitance, $C_{GD}$, exists between the gate and drain of each of the active devices. This capacitance gives rise to a signal leakage phenomenon that has heretofore made the achievement of very wide dynamic range on the output signal of the amplification chain problematic.

The output signal produced by the third active device Q3 is AC-coupled through a capacitor to a load network. An RF output signal is developed across the load network and may be transmitted, for example by an antenna.

In operation of the amplification chain of FIG. 5, drain modulation is performed by applying an amplitude modulation signal to one or more of the drain supplies ($V_{DD1}$, $V_{DD2}$, $V_{DD3}$) while driving the signal input at a high level to drive at least the final amplifier stage, and preferably all the amplifier stages, into deep compression or switch mode. When the final amplifier stage is overdriven in this manner, the power of the RF output signal developed across the load network is proportional to the square of the supply voltage on the terminal $V_{DD3}$.

A normal mode of operation (as described, for example, in the above U.S. Pat. No. 6,191,653 in relation to a first embodiment thereof) would be to modulate the power supply input of the final stage (i.e., $V_{DD3}$) and to operate the power supply inputs of preceding stages (i.e., $V_{DD1}$, $V_{DD2}$) at a fixed voltage. In this mode of operation, modulation of the power supply input $V_{DD3}$ may require a voltage swing ratio of 8:1 for signals such as that used in the EDGE system.

Where it is required that the RF output power be varied over a wide range of power levels (e.g., 80 dB dynamic range), some of this dynamic range may be achieved by scaling down the applied amplitude modulation signal, i.e., by increasing its dynamic range. This method, however, is limited by feed-through of the Q3 input signal to the output via the capacitor $C_{GD3}$. Leakage of the input signal to the output signal causes AM to AM and AM to PM non-linearities at low levels of the power supply input $V_{DD3}$.

As described in U.S. Pat. No. 6,734,724 entitled POWER CONTROL AND MODULATION OF SWITCH MODE POWER AMPLIFIERS WITH ONE OR MORE STAGES, issued on May 11, 2004, and incorporated herein by reference, the foregoing problem may be alleviated by reducing the power supply input levels $V_{DD2}$ and/or $V_{DD1}$, to minimize feed-through due to the capacitor(s) $C_{GD}$. This technique has been shown to achieve an output power dynamic range of 40 dB or more, considerably short of the 80 dB desired for some cellular applications. A different approach is needed to achieve this extended dynamic range. Such an approach may be based on the following observations.

Figure 6:
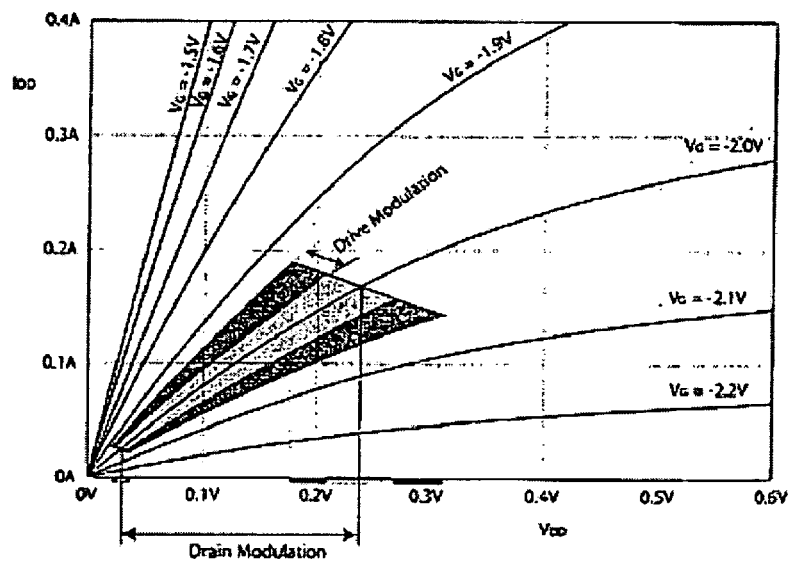
FIG. 6 is a plot of device characteristics for the amplifier section of FIG. 5.

When operating at low power levels corresponding to supply voltages of less than 1V (e.g., a few or several tenths of a volt), the amplifier stages may no longer operate in non-linear mode, if the RF input drive to a stage is reduced sufficiently so that it is no longer of sufficient magnitude to overcome the DC bias of that stage to turn it OFF. (For example, if the DC bias were set to −2V, and the FET threshold were −2.5V, any RF signal with magnitude 0.5V or less would not achieve the −2.5V necessary to turn the FET OFF.) FIG. 6 illustrates the characteristics of a typical active device, as well as a modulation approach enabling extended dynamic range to be achieved. (The curves shown in FIG. 6 are for a GaAs Metal Semiconductor Field Effect Transistor (MESFET) but would be similar for any FET device.) The modulation approach indicated may be applied at a single stage of the amplification chain, such as the final stage. More preferably, drain modulation is performed at the final stage, and drive modulation is performed at the initial stage, as described presently.

Referring again to FIG. 3, in the case of the final stage, the operating point is set by the power supply input $V_{DD3}$ and by the gate voltage $V_G$ applied from the previous stage. For a given $V_G$ (i.e., given drive voltage), as the power supply input $V_{DD3}$ is changed, the operating point of the of the device moves up and down the $V_G$ curve, and the output amplitude is modulated accordingly, as a function of the changing drain current IDD. This kind of modulation is indicated in FIG. 6 as "Drain Modulation."

To achieve the desired wide dynamic range, another kind of modulation is also required, indicated in FIG. 6 as "Drive Modulation." In particular, with the stage operating in the triode region, the output amplitude can also be changed by changing the input drive to the stage. With all stages operating with low supply voltage, all stages are in triode operation, and the output power level can be further reduced (beyond a level achievable with drain modulation alone) by reducing the input drive to the initial amplifier stage. Drain modulation is still applied to the final stage through the power supply input $V_{DD3}$, and at the same scaling. This manner of operation allows the output power to be further reduced, to a level of 80 dB or more down from the maximum power, thus achieving the desired dynamic range.

Figure 7:
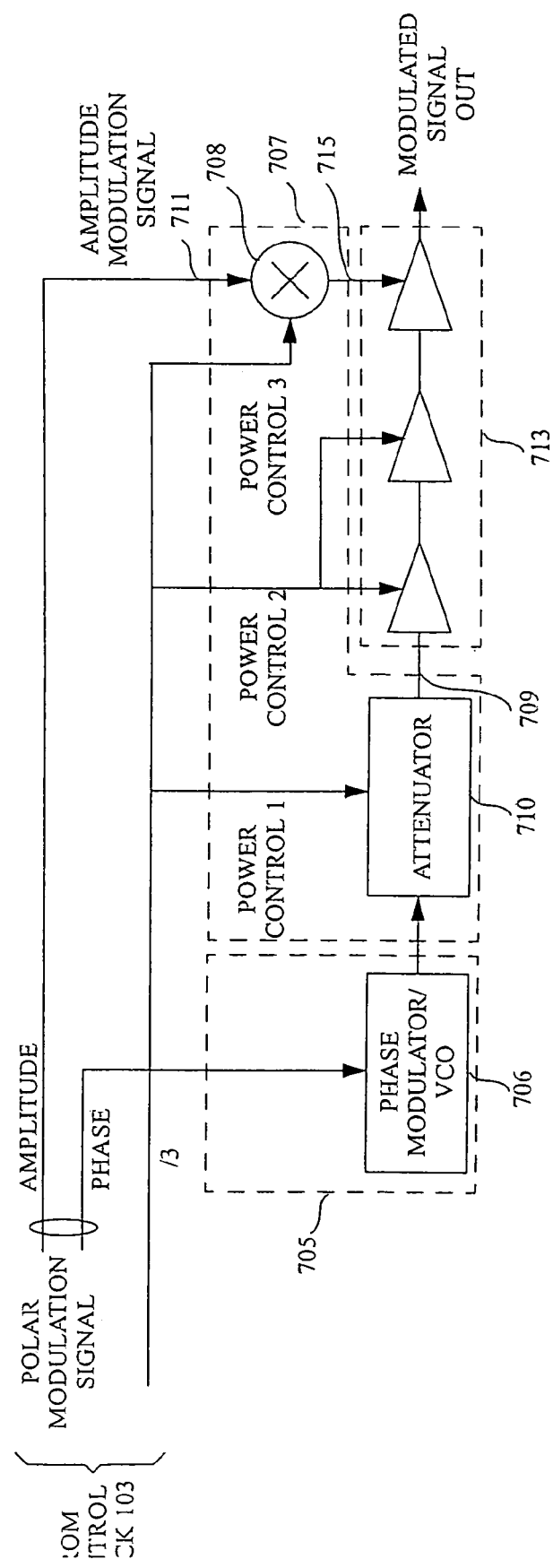
FIG. 7 is a more detailed block diagram of portions of one embodiment of the communications transmitter of FIG. 4.

Referring to FIG. 7, a more detailed block diagram is shown of one embodiment of the communications transmitter of FIG. 4. The amplification chain 713 includes three amplifier stages as previously described. A DDS/phase control block 705 includes a phase modulator/VCO 706. An amplitude control block 707 includes circuitry for achieving both drain modulation and drive modulation in the manner of FIG. 6. In particular, in the illustrated embodiment, three separate power control signals are provided by the control block 103 (not shown). One of these signals, Power Control 2, is applied in common to the power supply inputs of the stages preceding the final stage. Another one of these signals, Power Control 3, is combined with an amplitude modulation signal 711 from the control block, using a multiplier 708, to produce a power supply input 715 for the final stage. Using this arrangement, because the amplitude modulation signal 711 is independent of power control signals, non-linearity in the power control signals does not affect modulation linearity. Finally, a signal Power Control 1 sets the power of the signal 709 into the amplifier by, in this embodiment, controlling the attenuation of a variable attenuator 710.

In operation, when a comparatively high average output power is desired, the signals Power Control 2 and Power Control 3 are set to a range well beyond that illustrated in FIG. 6 (e.g., more than about 3 volts), and the signal input is minimally attenuated or subjected to gain, with the result that the amplifier stages are all operated in deep compression, or switch mode. In this region, the signal input level has a negligible effect on output power. For purposes of output power control, the signal Power Control 1 could be set to zero attenuation. However, it is desirable to provide substantial reverse isolation between the amplification chain and the phase modulator/VCO (e.g., to avoid VCO pulling). If the attenuator were set to zero attenuation, no reverse isolation would be achieved. By instead setting the signal Power Control 1 so as to maintain at least some minimum attenuation, reverse isolation may be achieved. The minimum attenuation is not so great as to prevent switch mode operation from being achieved. Amplitude modulation is applied solely through the amplitude modulation signal.

When a comparatively low average output power is desired, the signals Power Control 2 and Power Control 3 are set to within the range illustrated in FIG. 6 (e.g., a few or several tenths of a volt), with the result that, with the gate bias values shown, the amplifier stages are all operated in triode mode. In this region the signal input level has a substantial effect on output power. The signal Power Control 1 is used to apply drive modulation after the manner of FIG. 6. This effects an additional control on average output power, independent of any amplitude modulation, which is still applied through the amplitude modulation signal.

For very low power signals, the drive signal will be strongly attenuated, the degree of attenuation being reduced as desired signal power increases, until some minimum attenuation level is encountered. As desired signal power further increases, the signals Power Control 2 and Power Control 3 are increased so as to resume switch mode operation.

Figure 8:
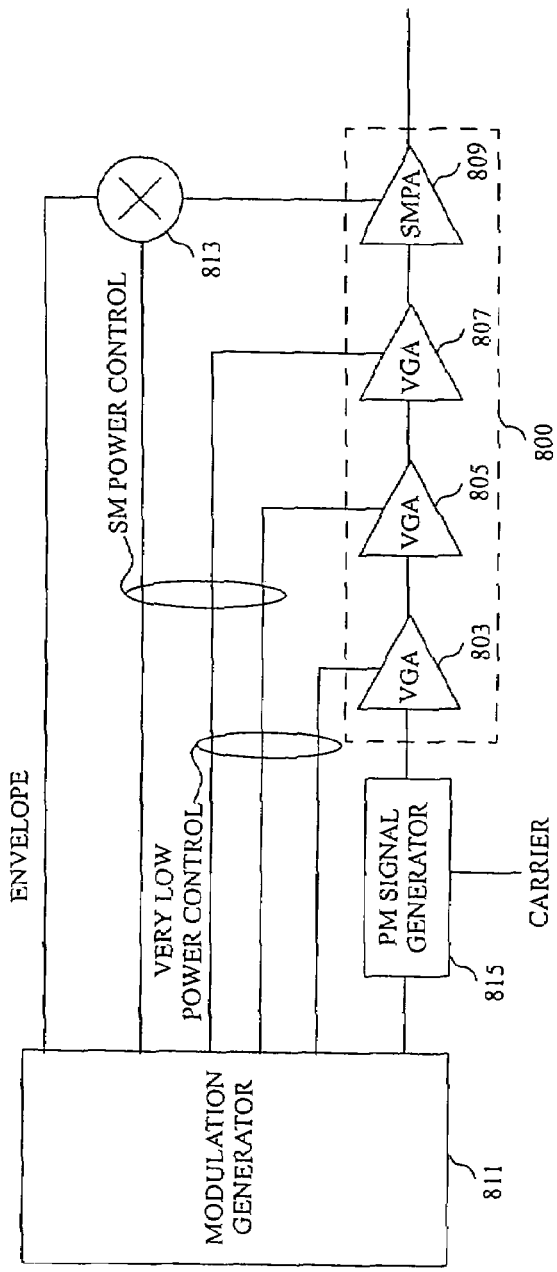
FIG. 8 is a block diagram of another embodiment of the communications transmitter.

Referring to FIG. 8, another embodiment of the communications transmitter is shown, similar to that of FIG. 7. In this embodiment, an amplification chain 800 includes multiple cascaded VGA stages (803, 805, 807) followed by a final switch-mode power amplifier stage (SMPA) 809 that, except for very low output powers, remains in switch mode. A modulation generator 811 produces power control signals for each stage, including the VGA stages, which may be operated to have either positive gain or negative gain (i.e., attenuation), and the SMPA stage. A multiplier 813 is provided that receives an envelope signal and a power control signal for the SMPA stage from the modulation generator, forms the product, and applies the resulting signal as the power supply to the SMPA. The power control signals for the VGA stages, in particular, are used to control the output power at very low power levels. For switch mode power control at moderate and high power levels, all of the power control signals play an active role with the exception of the power control signal for the initial stage, used more particularly for very low power control.

A PM signal generator 815 receives modulation information from the modulation generator and a carrier signal and generates phase modulated output signal, which is applied to an RF input of the amplification chain.

The technical basis of the present invention may be further appreciated from the following description with reference to FIG. 10 through FIG. 16.

The approach followed, as previously described, entails switch-mode operation at high and medium output power, and conversion to "multiplicative mode" at low output powers.

Figure 10:
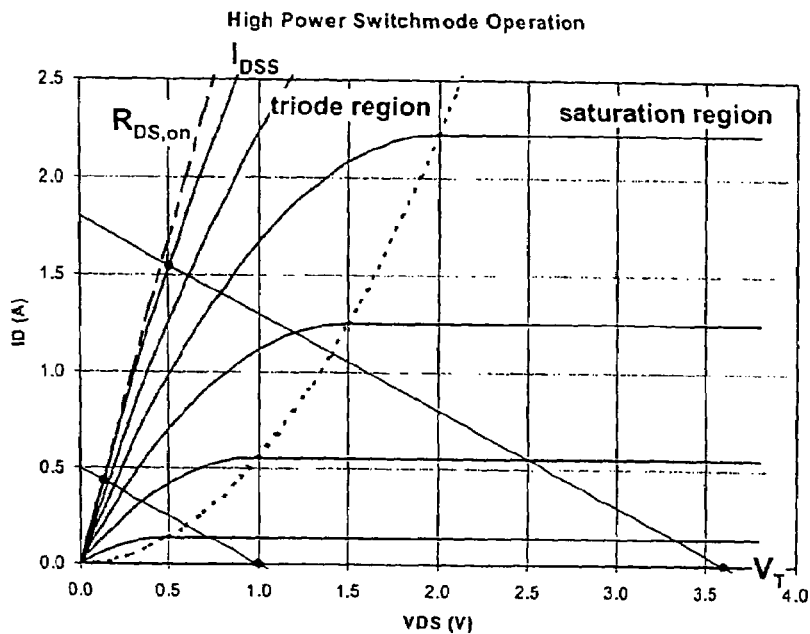
FIG. 10 is a plot illustrating high power switch-mode operation.

Referring to FIG. 10, the characteristic curves of a MESFET transistor are shown. (Other FET devices exhibit similar characteristics.) Beyond a certain drive voltage, the transistor is saturated and sources a maximum amount of current, $I_{DSS}$, for existing load conditions. At relatively low values of VDS, the current $I_{DSS}$ is proportional to VDS in accordance with a proportionality constant $R_{DS}$, on. At increasingly higher values of VDS, the current $I_{DSS}$ drops off by an increasing amount.

The operating space may be separated into two regions, a triode region in which a change in drive voltage produces a proportional change in current, and a "saturation region" in which this proportional relationship no longer holds.

During high power operation, the switching transistor is always driven hard, in switch mode. Hence, the transistor "snaps" between two operating points, an ON operating point at $I_{DSS}$, near $R_{DS, on}$, and an OFF operating point beyond the threshold voltage $V_T$, causing the transistor to enter cutoff. A line joining these two points is analogous to a conventional load line; note, however, that at high power, the transistor is not operated anywhere except at the endpoints for any appreciable portion of time. Through the mechanism of drain modulation, previously described, the voltage VDS may be controlled. As a result, the load line may be shifted, with the transistor still being operated in switch mode.

Figure 11:
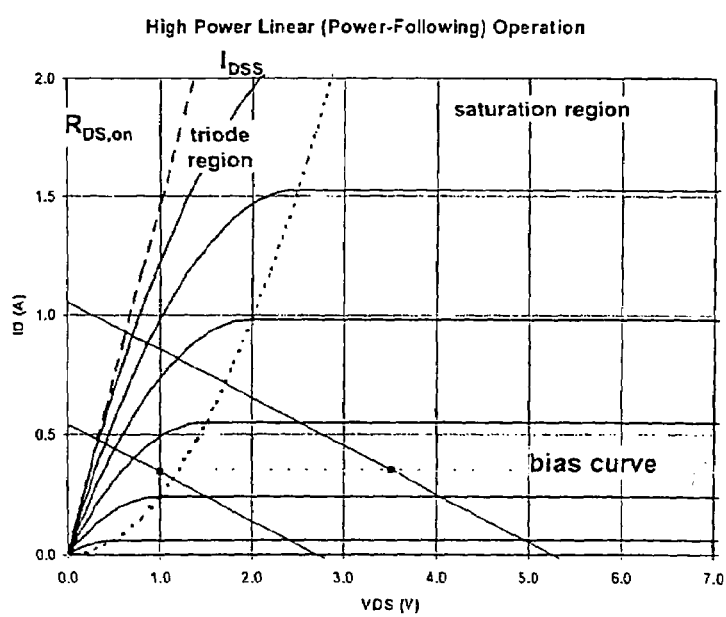
FIG. 11 is a plot illustrating operation of a conventional amplifier.

This manner of operation may be contrasted with that of conventional amplifiers. In conventional amplifiers, as illustrated in FIG. 11, the transistor operates along a load line about a bias point defined by a bias curve. With no applied drive signal, the amplifier operates at the intersection of the load line and the bias curve. Positive drive causes the operating point to move up the load line, and negative drive causes the operating point to move down along the load line. There is no snapping between two operating points as in FIG. 10. Efficiency may be improved using power-tracking methods in which the power supply voltage is reduced as the average output power is reduced. However, if the power supply voltage is reduced to a degree that the device enters the triode region (as shown), potentially serious signal distortion results.

Figure 12:
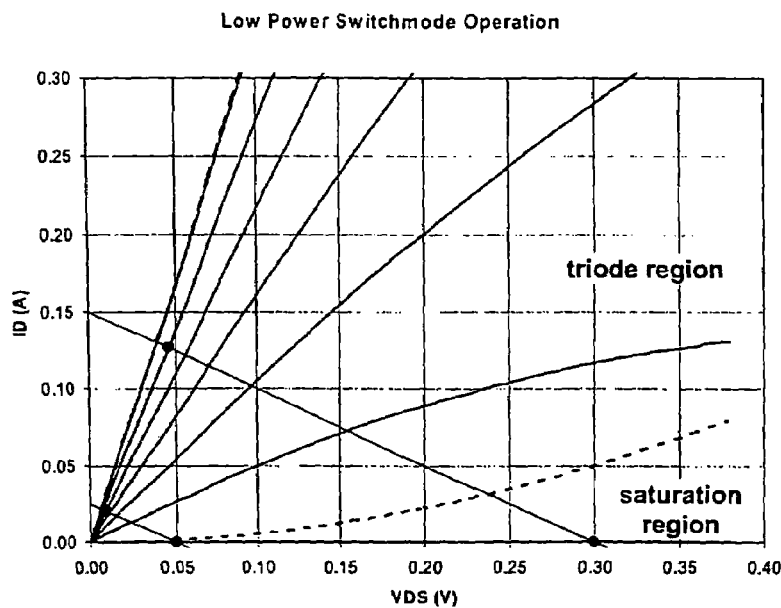
FIG. 12 is a plot illustrating low power switch-mode operation.
Figure 13:
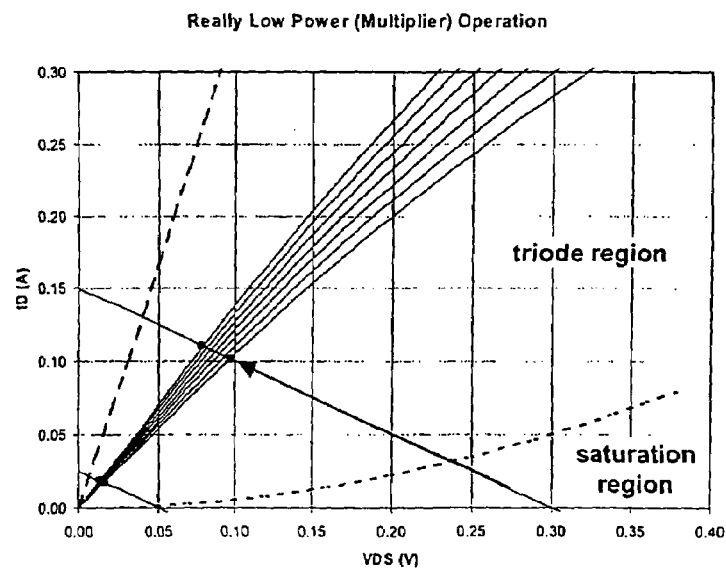
FIG. 13 is a plot illustrating very low power, multiplicative-mode operation.

FIG. 12 and FIG. 13 show magnified views of curves of FIG. 10, closer in toward the origin. Referring to FIG. 12, at moderately low power, a similar manner of operation as in FIG. 10 is followed. To reduce feedthrough effects, the drive signal is reduced, preferably to a level just sufficient to maintain switch mode. However, feedthrough effects still set a lower limit on the achievable average output power. Achieving average output power below this lower limit requires a different operating mechanism.

Such an operating mechanism is illustrated in FIG. 13. By reducing the input drive to stay above cutoff, the operating point that in prior figures corresponded to cutoff is now pushed in along the load line, into the "deep-triode" region. Operation of the device is no longer confined to the endpoints. Rather, the operating point of the device is moved along the load line by modulation of the drive signal (i.e., modulation of VGS). Furthermore, the load line may be shifted toward or away from the origin using drain modulation (i.e., changing VDS). This mode of operation is referred to herein as "multiplicative mode," since the device output is proportional to the product of the drive voltage and the drain voltage. Changing VDS effects amplitude modulation since, as the load line is shifted toward or away from the origin, the curves grow farther apart or closer together. Changing VGS effects power control by increasing or decreasing the drain current ID.

Figure 14:
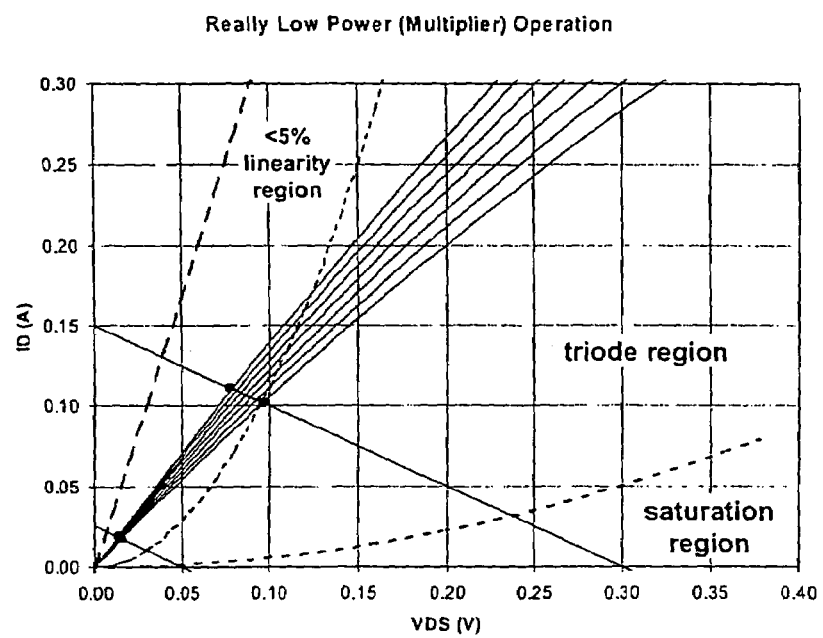
FIG. 14 is a plot like that of FIG. 13, showing the boundary of a 5% linearity region.

By changing the bias level, the device may be caused to operate across a different subset of curves either closer to or farther away from $R_{DS, on}$. The multiplicative action of the device exhibits greater linearity and lower gain when the device is operated closer to $R_{DS, on}$. FIG. 14, for example, shows a 5% linearity region within which the multiplicative action of the device exhibits linearity within 5%. The current through the device, ID, is only weakly affected by changes in bias, implying good temperature stability characteristics.

The multiplicative nature of device operation in the deep-triode region follows from well-established device models. While these models chosen are specific to a certain kind of devices, it should be understood that many different kinds of devices exhibit similar behavior and may be used in connection with the present invention. Triode tube devices could be used, for example, which have only a triode region and no saturation region. Hence, the following mathematical description is exemplary only.

For FETs, device operation in the saturation region and in the triode region, respectively, is described by the following equations:

$$I_D = K(V_{GS} - V_T)^2;$$

$$I_D = K(2(V_{GS} - V_T)V_{DS} - V_{DS}^2), \text{ where}$$

-continued $$K = \frac{I_{DSS}}{V_T^2}$$

The boundary between the saturation and triode regions is defined by the simultaneous equations $$V_{DS} = V_{GS} - V_T$$

$$I_D = K V_{DS}^2$$

In the deep-triode region $V_{DS} \ll V_{GS} - V_T$, resulting in $$\begin{aligned} I_D &= 2K(V_{GS} - V_T)V_{DS} \\ &= 2K(V_{GS}V_{DS} - V_T V_{DS}) \end{aligned}$$

Hence, $$I_D(t) = 2K(V_{GS}(t)V_{DS}(t) - V_T V_{DS}(t))$$

The last term of the expansion may be considered a bias term V.sub.b(t); i.e., it varies at the envelope frequency (typically much less than 10 MHz, as compared to the RF frequency of 1-2 GHz). By taking 2 $KV_{DS}(t)=G(t)$, the latter equation may be rewritten as:

$$I_D = G(t)V_{GS}(t) + V_b(t)$$

The bias term is readily filtered out, using an output coupling capacitor, for example, leaving the product of the envelope modulation signal G(t) and the drive modulation (power control) signal $V_{GS}(t)$.

Various methods may be used to control the transition between triode mode and switch mode in a smooth, glitch-free manner.

In one embodiment, a particular average power threshold, say −5 dBm, is identified (e.g., empirically determined). For average power levels above this threshold, the amplifier is operated in normal "switched-mode". For average power levels below this threshold, the various stages of the power amplifier are operated at conditions suitable for achieving the threshold power output; reduction of the average power below the threshold level requires only reducing the RF signal input level (e.g., by increasing the attenuation between the phase modulator and the first stage of the power amplifier). In this way, there are clearly no glitches as the attenuation can be smoothly controlled; however, there is a potential for nonlinear power steps in that a 5 dB increase in attenuation, for example, may not result in a 5 dB decrease in average output power when operating close to the threshold. Far below the threshold the output power versus attenuation curve is very linear, but close to the threshold the output power versus attenuation curve is somewhat compressed. This compression needs to be pre-corrected for in the choice of attenuation applied to arrive at a particular power level. Such adjustment is easily accomplished.

Another embodiment avoids the need for such adjustment, as follows. When operating below the threshold, the various stages of the power amplifier are not operated at the threshold conditions but instead are operated at conditions appropriate for a higher power level (e.g., if the threshold is −5 dBm, the power amplifier stages are operated as if the desired power level was, say 0 dBm). The attenuation before the first stage of the power amplifier must be greater this way, but the greater attenuation substantially avoids the nonlinear relationship between an attenuation step and the resulting step in output power when output power is close to the threshold. Determination of the attenuation setting to be used for the power level immediately below the threshold may be easily accomplished by one skilled in the art of RF measurements. Once this value is set, lower power levels may be achieved in linear dB steps through linear dB steps of the attenuator.

Various other embodiments may be used to advantage. For example, in the low output power mode in which all amplifier stages are operated in triode mode, instead of applying any amplitude modulation on the final stage as described, amplitude modulation can be applied at any of the stages in the amplifier chain, including any of the stages preceding the final stage, using an appropriate amplitude modulator such as the multiplier previously described.

The desired amplitude modulation characteristic need not be applied through a single signal or single stage. Rather, the desired amplitude modulation characteristic may, if desired, be broken up into multiple amplitude modulation signals, the product of which yields the desired amplitude modulation characteristic. These multiple amplitude modulation signals may be applied to any combination of the amplifier stages and the amplitude varying circuit. Furthermore, the foregoing modulation approach may be applied to any stage so long as all succeeding stages operate linearly.

Furthermore, if desired, the same amplitude modulation signal may be applied to multiple control ports. Applying the modulation to two ports effects a squared signal modulation, applying the modulation to three ports effects a cubic signal modulation, and so forth. When the amplifier is operated in this manner, each stage effectively acts as an independent multiplier.

Figure 9:
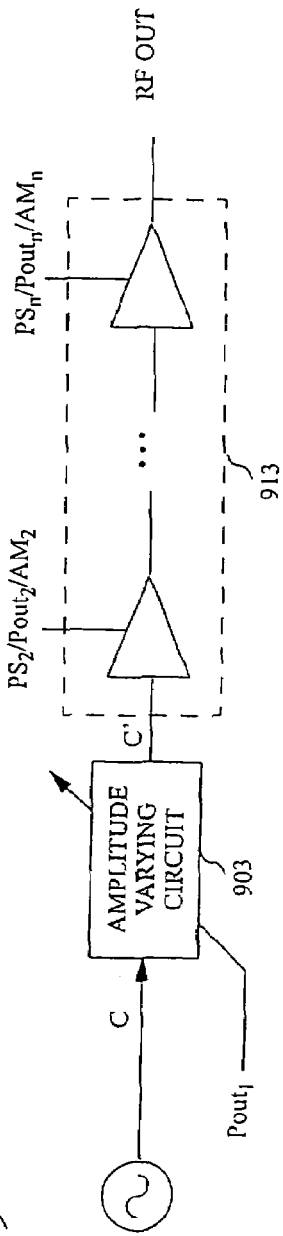
FIG. 9 is a more generalized block diagram of the present communications signal transmitter.

Referring to FIG. 9, a more generalized block diagram of a communications signal amplifier is shown, embracing the foregoing variations. A carrier signal C is applied to an amplitude varying circuit 903 responsive to a power control signal Pout.sub.1 to produce a carrier signal C'. The carrier signal C' is then amplified by a linear amplifier chain 913 having one or multiple stages. The power supply of at least one such stage is varied in accordance with a desired amplitude modulation characteristic. The power supply input of each individual stage may be fixed (PS), varied in accordance only with a desired output power level (Pout) or in accordance only with a desired amplitude modulation characteristic (AM), or varied in accordance with both a desired output power level and a desired amplitude modulation characteristic (Pout/AM). In some instances, power supply inputs of multiple stages may have identical AM components.

EXAMPLE

Figure 15:
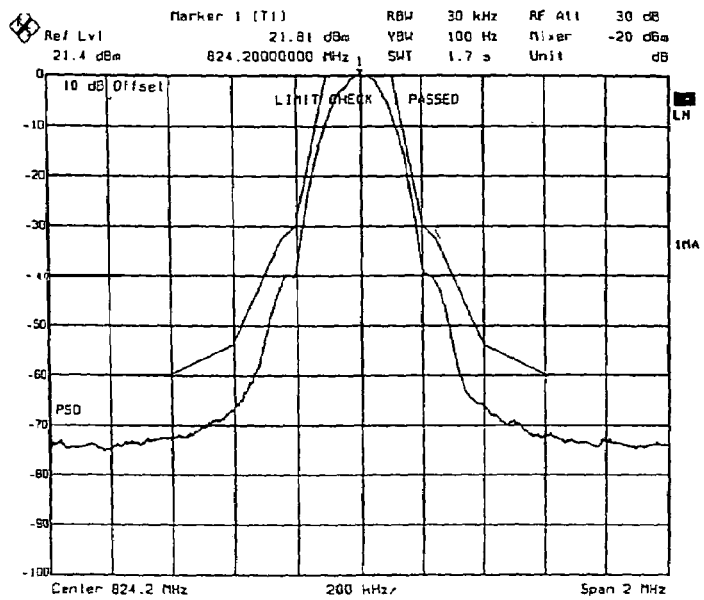
FIG. 15 is a spectrum plot of an EDGE signal at 30 dBm.
Figure 16:
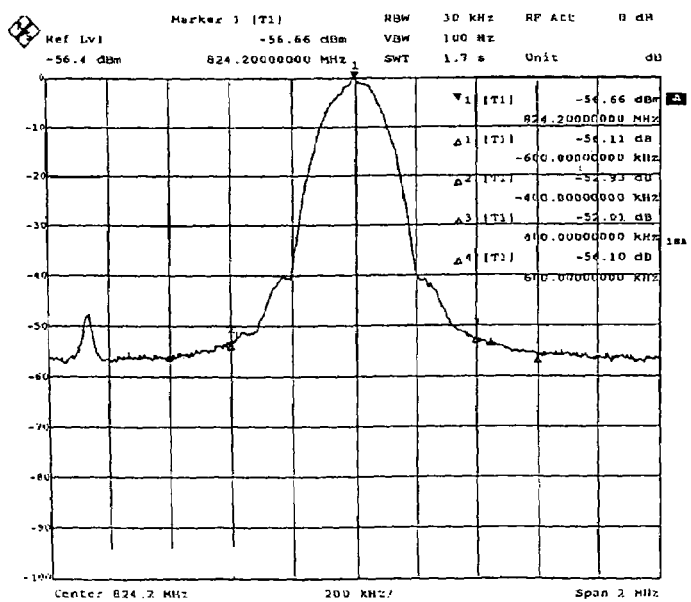
FIG. 16 is a spectrum plot of the same EDGE signal at −50 dBm.

The foregoing method was applied to a demonstration board to control the average output power of a board-generated signal compliant with the EDGE specification from a maximum output power of 30 dBm down to very low output power of −50 dBm. The spectrum and error vector magnitude (EVM) of the output signal at both high power and at low power was measured. The results are shown in FIG. 15 and FIG. 16, respectively. Almost no spectral degradation or EVM degradation is observed.

Thus, there have been described power control methods and apparatus for achieving extremely high dynamic range power control with inherent accuracy and outstanding signal fidelity over the entire dynamic range. To achieve low output power signals, the power supply inputs of the amplifier stages are set for triode operation, at very low (possibly negative) gain. The power supply input of the final stage is amplitude modulated (using drain modulation), and the amplitude of the drive signal is adjusted in a series of steps through variable power supply voltage settings of the driver transistors and also through input attenuation (drive modulation). As a result, it becomes possible to produce output signals having average power anywhere within a wide range, or to greatly increase the dynamic range over which amplitude modulation may be produced at a given average power level, or both.

With envelope modulation applied at the final amplifier stage, modulator and amplifier noise are suppressed, with the result that the signal noise floor is limited by the noise characteristics of the frequency determining element, i.e., the VCO. Independent control of envelope power and average output power is made possible, which, although not required, allows the envelope insertion procedure to have fixed scaling, independent of output level. In any event, no variation of the output network (load line) is required. Furthermore, no triode distortion occurs as in known power-tracking methods.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A circuitry comprising:
   a phase controller for producing a phase modulation signal;
   an amplitude controller for producing an attenuated phase modulation signal from the phase modulation signal responsive to a first control signal and a power supply signal from an amplitude modulation signal responsive to a second control signal which is independent of the first control signal; and
   an amplifier having a stage for producing a modulated communications signal responsive to the attenuated phase modulation signal and the power supply signal.

2. The circuitry according to claim 1, wherein said amplitude controller comprises an attenuator for producing the attenuated phase modulation signal.

3. The circuitry according to claim 1, wherein said amplitude controller comprises a multiplier for producing the power supply signal.

4. The circuitry according to claim 1, wherein said amplifier comprises a first stage for producing an input signal responsive to the attenuated phase modulation signal and a third control signal, the third control signal being independent of the first and second control signals, and a second stage for producing the modulated communications signal responsive to the input signal and the power supply signal.

5. The circuitry according to claim 4, wherein the first and third control signals are set such that the second stage is operated in switch mode when a comparatively higher average output power is desired, and the first and third control signals are set such that the second stage is operated in triode mode when a comparatively lower average output power is desired.

6. A circuitry for causing an external amplifier to produce a modulated communications signal responsive to an attenuated phase modulation signal and a power supply signal, comprising:
   a phase controller for producing a phase modulation signal; and
   an amplitude controller for producing the attenuated phase modulation signal from the phase modulation signal responsive to a first control signal and the power supply signal from an amplitude modulation signal responsive to a second control signal which is independent of the first control signal.

7. A circuitry comprising:
   an amplification chain including a switch-mode power amplifier stage and one or more VGA stages which may be operated to have either positive gain or negative gain;
   a modulation generator for producing a power control signal for each stage of said amplification chain;
   a multiplier for producing and supplying to said switch-mode power amplifier stage a power supply signal responsive to an envelope signal and the power control signal; and
   a phase-modulation signal generator for producing and supplying to an RF input of said amplification chain a phase modulated output signal responsive to modulation information and a carry signal.

* * * * *